United States Patent
Xu et al.

(10) Patent No.: US 11,955,381 B2
(45) Date of Patent: Apr. 9, 2024

(54) LOW-TEMPERATURE PLASMA PRE-CLEAN FOR SELECTIVE GAP FILL

(71) Applicant: Applied Materials, Inc., Santa Clara, CA (US)

(72) Inventors: Yi Xu, San Jose, CA (US); Yufei Hu, Fremont, CA (US); Kazuya Daito, Milipitas, CA (US); Geraldine M. Vasquez, Mountain View, CA (US); Da He, Santa Clara, CA (US); Jallepally Ravi, San Ramon, CA (US); Yu Lei, Belmont, CA (US); Dien-Yeh Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 129 days.

(21) Appl. No.: 16/908,076

(22) Filed: Jun. 22, 2020

(65) Prior Publication Data
US 2021/0398850 A1    Dec. 23, 2021

(51) Int. Cl.
| | |
|---|---|
| H01L 21/02 | (2006.01) |
| H01J 37/32 | (2006.01) |
| H01L 21/67 | (2006.01) |
| H01L 21/768 | (2006.01) |

(52) U.S. Cl.
CPC .. *H01L 21/76883* (2013.01); *H01J 37/32174* (2013.01); *H01L 21/02049* (2013.01); *H01L 21/02063* (2013.01); *H01L 21/67028* (2013.01)

(58) Field of Classification Search
CPC ......... H01L 21/02041; H01L 21/02057; H01L 21/02082; H01L 21/02063; H01L 21/0234
See application file for complete search history.

(56) References Cited

U.S. PATENT DOCUMENTS

| | | | |
|---|---|---|---|
| 9,362,130 B2 | 6/2016 | Ingle et al. | |
| 9,502,218 B2 | 11/2016 | Chen et al. | |
| 10,256,079 B2 | 4/2019 | Lubomirsky et al. | |
| 2003/0062333 A1* | 4/2003 | Kranz | H01L 21/76814 216/2 |

(Continued)

FOREIGN PATENT DOCUMENTS

| | | |
|---|---|---|
| JP | 2000332112 A | 11/2000 |
| KR | 20010039860 A | 5/2001 |

(Continued)

OTHER PUBLICATIONS

PCT International Search Report and Written Opinion in PCT/US2021/038014 dated Oct. 13, 2021, 10 pages.

*Primary Examiner* — Jae Lee
(74) *Attorney, Agent, or Firm* — Servilla Whitney LLC

(57) ABSTRACT

Methods for pre-cleaning substrates having metal and dielectric surfaces are described. A temperature of a pedestal comprising a cooling feature on which a substrate is located is set to less than or equal to 100° C. The substrate is exposed to a plasma treatment to remove chemical residual and/or impurities from features of the substrate including a metal bottom, dielectric sidewalls, and/or a field of dielectric and/or repair surface defects in the dielectric sidewalls and/or the field of the dielectric. The plasma treatment may be an oxygen plasma, for example, a direct oxygen plasma. Processing tools and computer readable media for practicing the method are also described.

20 Claims, 2 Drawing Sheets

(56) References Cited

U.S. PATENT DOCUMENTS

| | | | |
|---|---|---|---|
| 2011/0244680 A1 | 10/2011 | Tohnoe et al. | |
| 2015/0118862 A1 | 4/2015 | Reilly et al. | |
| 2015/0294906 A1* | 10/2015 | Wu | H01L 21/76877 438/653 |
| 2016/0365365 A1* | 12/2016 | Tian | H01L 21/02323 |
| 2018/0358260 A1* | 12/2018 | Roy | H01L 21/76801 |
| 2019/0019684 A1 | 1/2019 | Xu et al. | |

FOREIGN PATENT DOCUMENTS

| | | |
|---|---|---|
| KR | 20160051499 A | 5/2016 |
| WO | 2012148641 A2 | 11/2012 |

* cited by examiner

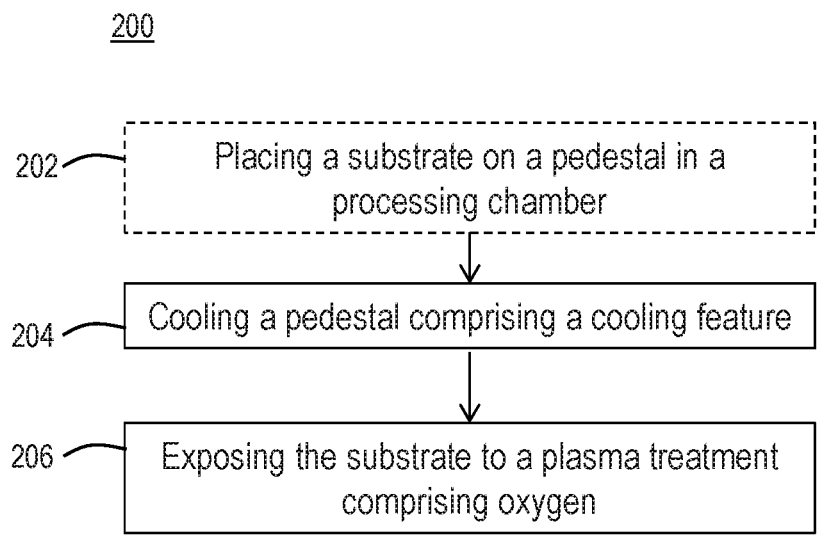

LOW-TEMPERATURE PLASMA PRE-CLEAN FOR SELECTIVE GAP FILL

TECHNICAL FIELD

Embodiments of the disclosure generally relate to methods for filling gaps in semiconductors. In particular, embodiment of disclosure relate to methods for pre-cleaning a substrate to improve metal deposition selectivity.

BACKGROUND

Interconnect metallization is widely used in logic and memory devices. A liner film followed by a bulk-deposited CVD/PVD film is typically used for via/trench gap fill applications. However, as the feature size decreases, the via/trench structures become smaller and the volume ratio of liner film increases, making it difficult to achieve defect free and low resistivity metal gap fill.

A selective deposition process takes advantage of an incubation difference on one surface material versus another surface material during deposition. This incubation delay could be leveraged to enable bottom-up gap fill without seam/void and liner film. However, there are several challenges that prevent this technique from broader application. For example, impurities on the via bottom and dielectric surface can reduce selectivity of a selective metal growth on metal surface versus dielectric field. Current processes employing heated plasma (e.g., $H_2$ plasma or $O_2$ plasma) to clean surface contaminants (e.g., oxygen, carbon, fluorine, chlorine) can result in unstable wafer temperatures and temperature increases of wafers on the order of 30° C. to 100° C. In turn, there is an increase in metal oxidation and challenges for following treatment and deposition processes.

In general, cleaning the metal surface efficiently while still maintaining no or minimal growth on the field is a major challenge preventing widespread use. Also, different surface structures with different etch residues or contaminants may need different pre-clean processes to enable selective growth.

Accordingly, there is an ongoing need in the art for improved methods and apparatus to pre-clean substrate surfaces for selective deposition.

SUMMARY

One or more embodiments of the disclosure are directed to methods of pre-cleaning. A substrate comprising a surface structure with a metal bottom, dielectric sidewalls, and a field of the dielectric is on a pedestal comprising a cooling feature. A temperature of the pedestal is set to less than or equal to 100° C. The substrate is exposed to a plasma treatment to remove chemical residual and/or impurities from the metal bottom, the dielectric sidewalls, and/or the field of the dielectric and/or repair surface defects in the dielectric sidewalls and/or the field of the dielectric.

Additional embodiments of the disclosure are directed to methods of pre-cleaning a substrate comprising a surface structure with a metal bottom, dielectric sidewalls, and a field of the dielectric. The substrate is positioned in a processing chamber on a pedestal that comprises radio frequency (RF) capability and a cooling feature. A temperature of the pedestal is set to less than or equal to 100° C. The substrate is exposed to a plasma treatment in the processing chamber to remove chemical residual and/or impurities from the metal bottom, the dielectric sidewalls, and/or the field of the dielectric and/or repair surface defects in the dielectric sidewalls and/or the field of the dielectric, wherein the plasma treatment comprises a hydrogen plasma and an oxygen plasma.

Further embodiments of the disclosure are directed to non-transitory computer readable medium, including instructions, that, when executed by a controller of a processing chamber, causes the processing chamber to perform operations of: positioning a substrate on a pedestal in a first processing chamber, the pedestal comprising a cooling feature; exposing the substrate to a plasma treatment in the first processing chamber; and setting a temperature of the pedestal to less than or equal to 100° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2 illustrates a flowchart of a method in accordance with one or more embodiments of the disclosure.

DETAILED DESCRIPTION

Figure 1:
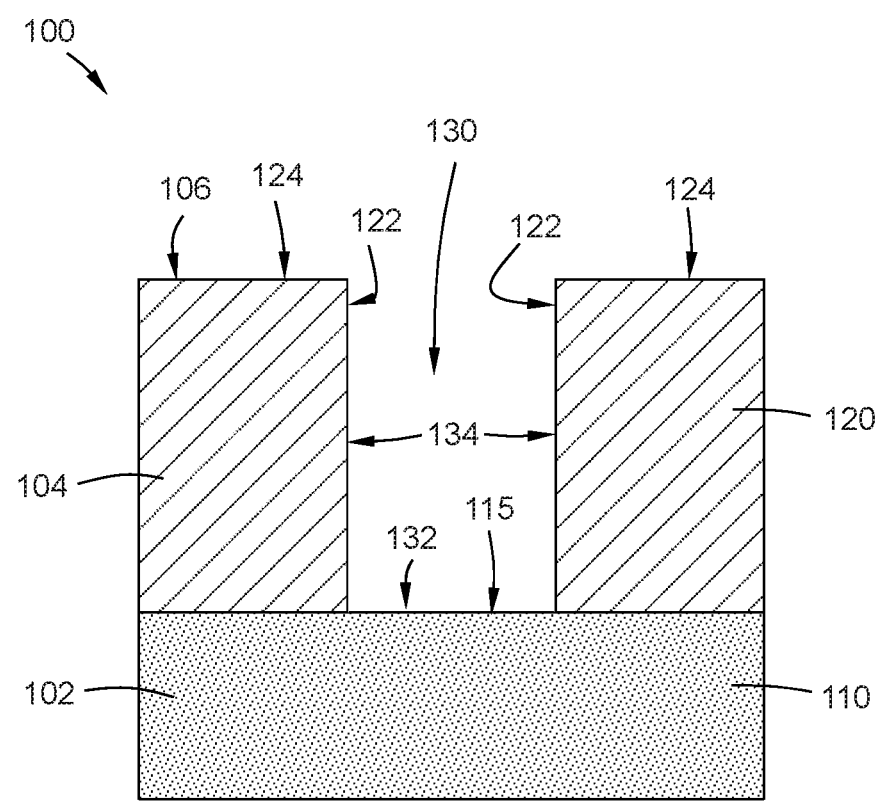
FIG. 1 shows a schematic representation of a substrate structure in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods for pre-cleaning a substrate for a wider range of structure types and selectivity windows. Some embodiments advantageously provide a low temperature treatment with a low temperature plasma pedestal, which can provide a stable temperature window at room temp to sub-zero temperature during pre-cleaning in the presence of plasma. With the processes herein, advantageously, dielectric selectivity is improved and impurity removal capability is sustained, while metal oxidation (not-preferred) is suppressed. Thereafter, selectivity of metal deposition is improved. In one or more embodiments, selectivity of tungsten (W) deposition is improved following low temperature pre-clean in the presence of any oxygen plasma, specifically a direct oxygen plasma.

Some embodiments of the disclosure provide methods for selective metal deposition processes in contacts or via bottoms which require a clean surface to start with for minimum incubation. In some embodiments, chemical residual and/or impurities, including but not limited to: metal oxide/metal nitride/metal carbide, etc., which may hinder the selective deposition process and cause significant incubation delay, are removed. Some embodiments can effectively clean metal contaminants while keeping contact/via structure preferable for selective process.

Processes of the disclosure use a cooled pedestal. The pedestal comprises a cooling feature that enables heat generated by plasma to be dissipated such that a temperature of a substrate is kept stable and below a desired temperature. In one or more embodiments, a cooling feature of the pedestal may be a heat exchange channel (not illustrated) through which a heat exchange fluid flows to control the temperature of the substrate. Exemplary heat exchange fluids are ethylene glycol or water. In one or more embodiments, the pedestal comprises radio frequency (RF) capability.

In one or more embodiments, a temperature of the pedestal is set to less than or equal to 100° C., including greater than or equal to −20° C. to less than or equal to 85° C., less than or equal to 60° C., less than or equal to 40° C., less than or equal to 35° C., and all values and subranges therebetween. In one or more embodiments, the cooled pedestal has radio frequency (RF) capability. During the processes, the substrate is exposed to a plasma treatment to remove chemical residual and/or impurities from the metal bottom, the dielectric sidewalls, and/or the field of the dielectric and/or repair surface defects in the dielectric sidewalls and/or the field of the dielectric. In one or more embodiments, the plasma treatment comprises an oxygen plasma. In one or more embodiments, the oxygen plasma is a direct plasma. In one or more embodiments, the plasma treatment further comprises a hydrogen plasma, for example, a direct hydrogen plasma.

In an exemplary non-limiting embodiment, a cleaning process sequence comprises: (1) setting and maintaining a temperature of a radio frequency (RF) capable pedestal in a processing chamber to a range of −20° C. to 100° C.; (2) conducting a direct plasma treatment of a substrate in the processing chamber, where the plasma comprises hydrogen. The hydrogen plasma is to reduce major metal contaminant—i.e. metal oxide and metal nitride reduction to pure metal; and (3) conducting a direct plasma treatment of a substrate in the processing chamber, where the plasma comprises oxygen. In this step, the oxidation process can convert residual metal nitrides to oxides, which can be reduced to pure metal in the next step, and/or oxidize the sidewall and top field dielectric materials (oxide and nitride) which may have been damaged during the initial hydrogen plasma process. In some embodiments, the oxidation process repairs the dielectric surface with strong oxidation, maintaining high selectivity for selective metal deposition. Oxygen treatment can also reduce contamination by carbon/organic-based residues. During oxygen plasma exposure, a bias in a range of greater than or equal to 0 W and less than or equal to 1000 W, including all values and ranges therebetween, including greater than or equal to 200 W and less than or equal to 600 W, is applied to the substrate. One advantage of this process is that a high power and low temperature $O_2$ treatment provides strong dielectric recovery and weak metal oxidation.

In one or more embodiments, exposing the substrate on a cooled pedestal to a plasma treatment treats or cleans the substrate. In one or more embodiments, the substrate comprises at least one feature. The at least one feature may comprise any feature known to the skilled artisan, including, but not limited to a trench, a via, or a peak. In embodiments where exposing the substrate to a remote plasma and/or a direct plasma treats or cleans the substrate, the treating or cleaning removes one or more of a residue, e.g. from prior processing, and/or a native oxide.

Experiments showed that strong dielectric recovery occurred at high power (e.g., 200 W to 600 W during low temperature oxygen plasma treatment), regardless of temperature. Experiments also showed that weak metal oxidation occurred at low temperature (e.g., 100° C., 60° C., or 35° C. during oxygen plasma treatment) regardless of power.

FIG. 1 illustrates a contact structure used in accordance with one or more embodiments. The substrate 100 illustrated in FIG. 1 includes a structure 130 bounded by a first material 102 and a second material 104. The structure 130 comprising bottom 132 and sides 134 in the illustrated embodiment is a via or trench. The structure is bounded on the bottom 132 by the first material 102 and on the sides 134 by a second material 104 that is different than the first material 102. The first material 102 of some embodiments comprises a metal 110 which forms a metal bottom 115 of the structure. The metal 110 can be any suitable metal including, but not limited to, tungsten (W), cobalt (Co) and/or ruthenium (Ru). The first material 102, and the bottom 132 of the structure 130 in some embodiments comprises a non-metal. Suitable non-metals include but are not limited to metal nitrides (e.g., titanium nitride (TiN)), metal silicides (e.g., titanium silicide (TiSi)) or silicon (Si). As used in this specification and the appended claims, unless otherwise specified by subscripts, chemical formulae are representative of the elemental identity and are not intended to imply any particular stoichiometric ratios. For example, a titanium nitride (TiN) film can have any suitable combination of titanium and nitrogen atoms and are not limited to a unity relationship.

In some embodiments, the second material 104 comprises a dielectric 120. The sidewalls 134 of the structure 130 are formed by the sidewalls 122 of the dielectric 120. The top surface 106 of the second material 104 is also referred to as the field. In some embodiments, the second material 104 comprises a dielectric 120 with sidewalls 122 and a field 124. The dielectric 120 can be any suitable material including, but not limited to, silicon oxide (SiO), silicon dioxide ($SiO_2$), silicon nitride (SiN), silicon oxynitride (SiON), aluminum nitride (AlN), aluminum oxide (AlO) or a high-k dielectric material. In some embodiments, the second material 104 comprises a hardmask material (e.g., carbon (C)).

FIG. 2 illustrates a method 200 in accordance with one or more embodiments for pre-cleaning a substrate prior to selective deposition. Surface contaminants of some embodiments comprise one or more of oxygen, nitrogen, carbon or halogen (e.g., fluorine, chlorine, bromine or iodine). In some embodiments, the contaminants comprise organic compounds.

At operation 202, a substrate is optionally placed on a pedestal in a processing chamber. At operation 204, the pedestal comprising a cooling feature is cooled. One or more embodiments of the pedestal includes radio frequency (RF) capability. The temperature of the pedestal is kept below 100° C., including less than or equal to 85° C., 60° C., and 35° C. At operation 206, the substrate is exposed to a plasma treatment. Plasma treatment includes an oxygen plasma, for example, a direct oxygen plasma. Optionally, plasma treatment further comprises a hydrogen plasma, for example, a direct hydrogen plasma.

In one or more embodiments, the substrate is maintained at a temperature in the range of −20° C. to 100° C. during exposure to the oxygen plasma.

In some embodiments, the oxygen plasma is a capacitively-coupled plasma (CCP). In some embodiments, the oxygen ($O_2$) plasma is a high density, high energy plasma. In some embodiments, the low energy plasma has a power greater than or equal to 100 watts to less than or equal to 600 watts.

In some embodiments, the oxygen plasma has a pressure in the range of 1 Torr to 30 Torr.

In some embodiments, the hydrogen ($H_2$) plasma is a capacitively-coupled plasma (CCP). In some embodiments, the $H_2$ plasma is a low energy plasma.

In one or more embodiments, the hydrogen plasma has a pressure in the range of 1 Torr to 30 Torr.

After operation 206, the substrate may then be further processed for selective metal deposition. In one or more embodiments, after the cleaning process, the substrate is exposed to at least one precursor of a metal to selectively form a metal film on the substrate. In one or more embodiments, the method further comprises exposing the substrate to at least one precursor to deposit a film on the substrate vis a vis a plasma enhanced chemical vapor deposition (PECVD) process or a plasma enhanced atomic layer deposition process (PEALD). Any appropriate precursor known to the skill artisan may be used to form a film on the substrate.

In some embodiments, the pre-clean method illustrated in FIG. 2, efficiently cleans residues and enhances selectivity of a subsequent deposition process.

Various hardware arrangements can be used to implement the method 200. In some embodiments, for surface cleaning, one or two chambers can be applied to achieve multiple processes. Chambers can be used for $O_2$/$H_2$ plasma treatments with different gas species. $H_2$ and $O_2$ treatment in some embodiments are performed in one chamber.

Additional embodiments of the disclosure are directed to a processing system for executing the methods described herein.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

At least one controller may be coupled to one or both of the first chamber and the central transfer chamber. In some embodiments, there is more than one controller connected to the individual chambers or stations, and a primary control processor is coupled to each of the separate processors to control the system. The controller may be one of any form of general-purpose computer processor, microcontroller, microprocessor, etc., that can be used in an industrial setting for controlling various chambers and sub-processors.

The at least one controller can have a processor, a memory coupled to the processor, input/output devices coupled to the processor, and support circuits to communication between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor 952 to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller has one or more configurations to execute individual processes or sub-processes to perform the method. The controller can be connected to and configured to operate intermediate components to perform the functions of the methods. For example, the controller can be connected to and configured to control one or more of gas valves, actuators, motors, slit valves, vacuum control, etc.

The controller of some embodiments has one or more configurations selected from: a configuration to move a substrate on the robot between the plurality of processing chambers and metrology station; a configuration to load and/or unload substrates from the system; a configuration to move a substrate between and among the central transfer station and processing chambers.

One or more embodiments are directed to a non-transitory computer readable medium including instructions, that, when executed by a controller of a processing chamber, cause the processing chamber to perform the operations of positioning a substrate on a pedestal in a first processing chamber, the pedestal comprising a cooling feature; exposing the substrate to a plasma treatment in the first processing chamber; setting a temperature of the pedestal to less than or equal to 100° C. In one or more embodiments, the non-transitory computer readable medium includes instructions, that, when executed by the controller of the processing chamber, cause the processing chamber to perform the operation of exposing the substrate to at least one precursor to form a film on the substrate.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of pre-cleaning, the method comprising:
    exposing a substrate on a pedestal, the substrate comprising a surface structure including a metal bottom surface comprising one or more of tungsten (W), cobalt (Co), or ruthenium (Ru), exposed sidewall surfaces comprising dielectric material, and a field of dielectric, to a plasma treatment comprising an oxygen plasma to remove chemical residual and/or impurities from the metal bottom surface, the exposed sidewall surfaces comprising dielectric material, and the field of the dielectric and/or repair surface defects in the exposed sidewall surfaces comprising dielectric material and the field of the dielectric; and
    setting the plasma at a power and setting a temperature of the pedestal that comprises a cooling feature to greater than or equal to −20° C. and less than or equal to 60° C., wherein the pre-cleaning is effective to enhance selective metal deposition on the metal bottom surface.

2. The method of claim 1, wherein the pedestal comprises radio frequency (RF) capability.

3. The method of claim 1, wherein the oxygen plasma is a direct plasma.

4. The method of claim 1, wherein the plasma treatment further comprises a hydrogen plasma.

5. The method of claim 1, wherein a bias in a range of greater than or equal to 200 W and less than or equal to 1000 W is applied to the substrate during plasma exposure.

6. The method of claim 5, wherein the pedestal is maintained at a temperature in a range of greater than or equal to −20° C. to less than or equal to 40° C. during the plasma exposure.

7. The method of claim 1, wherein the exposed dielectric sidewall surfaces comprising dielectric material and the dielectric field comprise one or more of silicon nitride (SiN), silicon oxide (SiO), silicon oxynitride (SiON), or a high-k dielectric.

8. A processing method comprising:
    setting a plasma power and a temperature of a pedestal in a processing chamber to greater than or equal to −20° C. and less than or equal to 60° C., the pedestal comprising radio frequency (RF) capability and a cooling feature;
    exposing a substrate on the pedestal, the substrate comprising a surface structure including a metal bottom surface comprising one or more of tungsten (W), cobalt (Co), or ruthenium (Ru), exposed dielectric sidewall surfaces comprising dielectric material, and a field of dielectric, to a plasma treatment in the processing chamber to remove chemical residual and/or impurities from the metal bottom surface, the exposed dielectric sidewalls comprising dielectric material, and the field of the dielectric and/or repair surface defects in the exposed dielectric sidewall surfaces comprising dielectric material and/or the field of the dielectric, wherein the plasma treatment comprises an oxygen plasma; and
    exposing the substrate to at least one precursor of the metal to selectively form a metal film on the substrate by enhancing selective metal growth on the metal bottom surface.

9. The method of claim 8, wherein the oxygen plasma is a direct plasma.

10. The method of claim 8, wherein a bias in a range of greater than or equal to 200 W and less than or equal to 1000 W is applied to the substrate during the plasma exposure.

11. The method of claim 10, wherein the pedestal is maintained at a temperature in a range of greater than or equal to −20° C. to less than or equal to 40° C. during the plasma exposure.

12. The method of claim 8, wherein the exposed dielectric sidewall surfaces and the dielectric field comprise one or more of silicon nitride (SiN), silicon oxide (SiO), silicon oxynitride (SiON), or a high-k dielectric.

13. A non-transitory computer readable medium, including instructions, that, when executed by a controller of a processing chamber, causes the processing chamber to perform operations of:
    exposing a substrate comprising a surface structure including a metal bottom surface comprising one or more of tungsten (W), cobalt (Co), or ruthenium (Ru), exposed dielectric sidewall surfaces comprising dielectric material, and a field of dielectric on a pedestal comprising a cooling feature in a first processing chamber to a plasma treatment comprising an oxygen plasma in the first processing chamber; and setting a plasma power and a temperature of the pedestal to greater than or equal to −20° C. and less than or equal to 60° C. to repair surface defects in the exposed dielectric sidewall surfaces comprising dielectric material and to enhance selective metal deposition on the metal bottom surface.

14. The non-transitory computer readable medium of claim 13, wherein the pedestal comprises radio frequency (RF) capability.

15. The non-transitory computer readable medium of claim 13, further including instructions that, when executed by a controller of a processing chamber causes the processing chamber to perform the operation of: exposing the substrate to a hydrogen plasma.

16. The non-transitory computer readable medium of claim 15, wherein the oxygen plasma is a direct plasma.

17. The non-transitory computer readable medium of claim 13, further including instructions that, when executed by a controller of a processing chamber causes the processing chamber to perform the operation of: applying a bias in a range of greater than or equal to 200 W and less than or equal to 1000 W to the substrate during the plasma exposure.

18. The non-transitory computer readable medium of claim 13, further including instructions that, when executed by a controller of a processing chamber causes the processing chamber to perform the operation of: maintaining the pedestal at a temperature in a range of greater than or equal to −20° C. to less than 40° C. during the plasma exposure.

19. The non-transitory computer readable medium of claim 13, wherein the exposed dielectric sidewalls comprising dielectric material and the dielectric field comprise one or more of silicon nitride (SiN), silicon oxide (SiO), silicon oxynitride (SiON), or a high-k dielectric.

20. The method of claim 8, wherein the plasma treatment further comprises a hydrogen plasma.

\* \* \* \* \*

UNITED STATES PATENT AND TRADEMARK OFFICE
CERTIFICATE OF CORRECTION

PATENT NO. : 11,955,381 B2
APPLICATION NO. : 16/908076
DATED : April 9, 2024
INVENTOR(S) : Yi Xu et al.

It is certified that error appears in the above-identified patent and that said Letters Patent is hereby corrected as shown below:

In the Claims

•Column 7, Line 67, insert --and not on the exposed sidewall comprising dielectric material-- after "surface".

•Column 8, Line 42, insert --and not on the exposed sidewall comprising dielectric material-- after "surface".

•Column 9, Line 6, insert --and not on the exposed sidewall comprising dielectric material-- after "surface".

Signed and Sealed this
Twenty-eighth Day of May, 2024

Katherine Kelly Vidal
*Director of the United States Patent and Trademark Office*